US010607037B2

(12) United States Patent
De Gouvêa (10) Patent No.: US 10,607,037 B2
(45) Date of Patent: Mar. 31, 2020

(54) METHOD FOR MANAGING PROGRAMMABLE LOGIC CIRCUITS FOR APPLICATIONS INVOKING DYNAMIC LIBRARIES

(71) Applicant: SAMSUNG ELETRÔNICA DA AMAZÔNIA LTDA., Campinas, São Paulo (BR)

(72) Inventor: Romeu Palos De Gouvêa, Campinas (BR)

(73) Assignee: SAMSUNG ELECTRÔNICA DA AMAZÔNIA LTDA., Campinas-Sao Paulo (BR)

( * ) Notice: Subject to any disclaimer, the term of this patent is extended or adjusted under 35 U.S.C. 154(b) by 9 days.

(21) Appl. No.: 16/059,230

(22) Filed: Aug. 9, 2018

(65) Prior Publication Data

US 2019/0286779 A1    Sep. 19, 2019

(30) Foreign Application Priority Data

Mar. 14, 2018  (BR) .......................... 10 2018 005101

(51) Int. Cl.
*G06F 17/50*  (2006.01)
*G06F 30/34*  (2020.01)
(Continued)

(52) U.S. Cl.
CPC .......... *G06F 30/34* (2020.01); *G06F 15/7867* (2013.01); *H03K 19/1776* (2013.01)

(58) Field of Classification Search
CPC ........ G06F 30/34; G06F 30/30; G06F 3/0659; G06F 8/34; G06F 21/76; G06F 30/392; G06F 11/0787; G06F 11/1004; G06F 11/1012; G06F 11/1044; G06F 11/1068; G06F 11/2294; G06F 11/2733; G06F 11/362; G06F 13/102; G06F 2119/06; G06F 2119/12; G06F 21/602; G06F 21/72; G06F 21/78; G06F 21/85; G06F 30/327; G06F 30/398; G06F 3/061; G06F 3/0619;
(Continued)

(56) References Cited

U.S. PATENT DOCUMENTS

6,230,307 B1    5/2001   Davis et al.
6,557,156 B1    4/2003   Guccione
(Continued)

*Primary Examiner* — Binh C Tat (57) ABSTRACT

A method for managing a programmable logic circuit by invoking a dynamic library function. The method includes invoking an application programming interface (API) function by an application from a shared object; dynamically loading the library in memory and linked on demand; associating the library to a logic circuit configuration file describing logic connections within a programmable logic device (PLD); transmitting and loading the configuration file into the PLD to map the logic circuit configurations; writing, through the dynamic library, input data values as a circuit entry and clock signal for driving the logical execution of the function mapped in hardware; collecting through the dynamic library the output data values resulting of logic circuits execution by reading output of the logic circuit; converting through the dynamic library, the logic circuit output to the expected data type specified by the API function; and returning the data result to a calling application.

7 Claims, 4 Drawing Sheets

(51) Int. Cl.
*H03K 19/1776* (2020.01)
*G06F 15/78* (2006.01)

(58) Field of Classification Search
CPC .......... G06F 3/0646; G06F 3/067; G06F 8/30;
G06F 8/41; G06F 8/456; G06F 11/3648;
G06F 11/3656; G06F 16/137; G06F
9/5044; G06F 13/28; G06F 15/7867;
G06F 30/20; G06F 30/33; G06F 30/331;
G06F 30/333; G06F 7/483; G06F 11/261;
G06F 11/3664; G06F 12/0215; G06F
12/0246; G06F 12/0638; G06F 12/0866;
G06F 12/12; G06F 13/16; G06F 13/385;
G06F 13/4022; G06F 13/4059; G06F
15/7889; G06F 19/3418; G06F 1/10;
G06F 2111/04; G06F 2111/08; G06F
2117/06; G06F 2212/205; G06F
2212/654; G06F 2212/7203; G06F
30/3312; G06F 30/367; G06F 30/39;
G06F 30/394; G06F 30/0613; G06F
3/065; G06F 3/0679; G06F 7/499; G06F
7/49905; G06F 7/49915; G06F 8/35;
G06F 9/30145; G06F 9/30185; G06F
9/3877; G06F 9/3897; G06F 9/5072;
H03K 19/17736; H03K 19/017581; H03K
19/17724; H03K 19/1774; H03K
19/17744; H04L 45/586; H04L 49/9052;
G01R 31/3172
USPC .................................................. 716/110–117
See application file for complete search history.

(56) References Cited

U.S. PATENT DOCUMENTS

| | | | |
|---|---|---|---|
| 6,742,173 | B2 | 5/2004 | Spivey |
| 7,757,198 | B1* | 7/2010 | Zhao .................... G06F 17/5054 |
| | | | 716/103 |
| 9,038,072 | B2 | 5/2015 | Nollet et al. |
| 2004/0060032 | A1* | 3/2004 | McCubbrey ........ G06F 17/5054 |
| | | | 716/104 |
| 2005/0257186 | A1 | 11/2005 | Zilbershlag |
| 2009/0204933 | A1* | 8/2009 | Rezgui ............... H03K 19/0033 |
| | | | 716/122 |
| 2017/0206864 | A1 | 7/2017 | Kp et al. |

\* cited by examiner

METHOD FOR MANAGING PROGRAMMABLE LOGIC CIRCUITS FOR APPLICATIONS INVOKING DYNAMIC LIBRARIES

CROSS-REFERENCE TO RELATED APPLICATIONS

This application claims the foreign priority benefit of Brazilian Patent Application No. 10 2018 005101 6, filed on Mar. 14, 2018 in the Brazilian Intellectual Property Office, the disclosure of which is incorporated herein by reference.

FIELD

The present invention relates to the replacement of software shared libraries for its equivalent digital circuits (that potentially increases the execution speed and saves power). All the management of hardware resources, such as: space, memory availability and location inside FPGA (Field Programmable Gate Array) are handled by the OS (Operating System). According to the present invention, the software (SW) libraries only acts as wrappers for the hardware functions, to send the parameters to the digital circuits and respond back with incoming results afterwards. As consequence, existing applications which call those functions will transparently take advantage of the hardware (HW) acceleration without any modifications in the procedure call or source code. The Hardware management functions performed by OS can include: allocating circuits on demand, reusing them as necessary, and releasing them when they are no longer required.

BACKGROUND

Nowadays many functions usually performed by heavy software algorithms can be executed with dramatically greater performance and simplicity by programmable logic circuits such as PLD's (Programmable Logic Devices) and FPGA's (Field Programmable Gate Arrays). There are examples of acceleration of software algorithms by using programmable logic circuits in several areas such as encrypting and decrypting data, encoding and decoding video signals and other complex mathematic calculations.

The programmable logic circuit building blocks can be as complex as: microprocessors, buffers, multiplexers or converters blocks which can be connected by programming a matrix of connections, determined by a specific configuration file which describes the circuit, usually called "bitstream files".

In contrast, shared objects (e.g. DLLs) and similar libraries can be dynamically loaded on demand allowing to share objects and interfaces among several different software applications.

The present invention discloses a method for a software application being able to link to specific libraries, shared objects or DLLs which are able to configure on-demand programmable logic circuits and to drive them in a transparent way. Similarly, a shared object can be dynamically loaded and unloaded in memory on demand, and the related circuits in PLD (Programmable Logic Devices) or FPGA (Field Programmable Gate Arrays) can be dynamically allocated and released on demand, optimizing in both cases the resources usage.

A "shared library" or "shared object" is a set of software functions that can be used by different applications running on the same system. It allows the code to be improved without changing the user application and also allows reuse of code among different programs, therefore saving memory resources and loading time. The operating system already provides many shared libraries containing the most common operations and algorithms to be used by installed applications. The system only allocates a shared library if an application requires. When no application requires a given library, it is unloaded, and the related used memory is released.

Some examples of shared objects are: Dynamic-link Library (DLL) for Windows® and Shared Object for Linux.

The patent document U.S. Pat. No. 6,230,307 B1 titled "System and method for programming the hardware of field programmable gate arrays (FPGAs) and related reconfiguration resources as if they were software by creating hardware objects", by Xilinx, filed on Jan. 26, 1998, proposes the usage of FPGAs as software using high level atomic blocks in the hardware. The hardware is already programmed with determined types and quantities of those atomic units. The users define the architecture using the resources already available in the hardware as if they are programming software. The present invention differs from document U.S. Pat. No. 6,230,307 B1 for reprogramming the reconfigurable hardware in real time, and making it available on demand, when needed by any application. The OS kernel manages the allocated space and resources inside the hardware and releases or program them when needed without software intervention or even knowledge. By applying the method of the present invention, an application will be able to dynamically link a software library and trigger the hardware functionality as simply as performing a regular application program interface (API) call, accelerating its execution and hiding its complexity.

The patent document US 2005/257186 A1 titled "Operation system for programmable hardware", by Michael Zilbershlag, filed on May 13, 2004, proposes the usage of FPGA to accelerate the input signals processing from external hardware devices (joysticks, sensors, high speed radios, etc.). The present invention differs from document US 2005/257186 A1 by proposing a broader and more generic method in which any software can be used, regardless of using external hardware for input. The present invention also focuses on the operating system management of the hardware resources and configurations, without necessary intervention in the client application.

The patent document U.S. Pat. No. 9,038,072 B2 titled "System and Method for Hardware-Software Multitasking on a Reconfigurable Computing Platform", by IMEC, filed on Dec. 10, 2008, proposes the use of a reconfigurable FPGA to accelerate software tasks executing them on hardware, specially focusing on the multitasking of different applications. It is important to state that the application must be specially developed in order to support the proposition. The present invention differs from document U.S. Pat. No. 9,038,072 B2 by including the management of hardware blocks and their functionalities without the intervention in the client application. The client application does not need to be planned nor developed focusing the hardware acceleration, but it can be if necessary. Document U.S. Pat. No. 9,038,072 B2 cannot provide the benefits foreseen by the present invention, in terms of transparency for an external calling application, or in terms of flexibility, and it does not describe a logic link between Shared Object and the programmable hardware. In addition, the present invention includes the management of the allocation/release of circuits, and is not related to multitasking as in document U.S. Pat. No. 9,038,072 B2.

The patent document U.S. Pat. No. 6,557,156 B1 titled "Method of configuring FPGAS for dynamically reconfigurable computing", by Xilinx Inc., filed on Apr. 10, 2000, proposes a method of configuring FPGAs for reconfigurable computing. It uses high level code language (i.e. Java) and a set of libraries that allows an application to reprogram the FPGA in real time. The present invention differs from document U.S. Pat. No. 6,557,156 B1 by using the kernel to manage the hardware resources and libraries, allowing that simpler applications to use the advantages of hardware acceleration without any additional development efforts. By applying the present invention, an application will be able to dynamically link a software library and trigger the hardware functionality as simply as performing regular API call, accelerating its execution and hiding its complexity.

The patent document U.S. Pat. No. 6,742,173 B2 titled "Communication and control model for field programmable gate arrays and other programmable logic devices", by Rincon Research Corporation, filed on Jun. 20, 2002, proposes a method of abstraction of a hardware device (FPGA or other hardware platforms) as a digital storage medium for use with computer systems. The functional set of the hardware can be exposed to software without the knowledge of the architecture and physical composition of FPGA hardware. The present invention differs from document U.S. Pat. No. 6,742,173 B2 because this invention allows a software application to abstract and use hardware acceleration as if it were using software libraries, managing the hardware resources allocation and programming in the Operating System layer. Moreover, the present invention does not need to simulate the hardware as a digital storage medium.

The patent document US 2017/0206864 A1, titled "Methods and Apparatus to Provide Extended Graphics Processing Capabilities", filed on Apr. 1, 2017, by Intel Corporation, involves (a programmable driver interface) sending a display panel parameter to a shared library module, wherein "shared library module includes a first graphics processing capability". So, it is mainly covering the process for invoking a shared library module and passing it a parameters, which will lately be processed by a GPU. In an analogy with the present invention, it is related to the Shared Object module function call invocation by an Application which is just the trigger that starts the execution of the this DOI mechanism. However, document US 2017/0206864 A1 does not cover important concepts: the flexibility of functions being partially implemented by hardware program and partially by programmable hardware, functions being called transparently by external application without modifications, and the logical link between a Shared Object and Programmable hardware configuration.

Furthermore, the present invention is also related to the following technologies and solutions:

1) Programmable Logic Devices (http://www.mouser.com/applications/programmable-logic/): There are many types of Programmable Logic Devices (PLDs), beginning with simple combinations of digital logic that are integrated on one chip. Complex Programmable Logic Devices (CPLDs) and Field Programmable Gate Arrays (FPGAs) are general-purpose semiconductor devices that can be programmed after shipping. They are very design-flexible and user-customizable hardware devices that can implement any logical function that an application-specific integrated circuit could perform, but the ability to update the functionality offers advantages for many applications.

2) A Programmable Logic Array (PLA) (https://en.wikipedia.org/wiki/Programmable_logic_array) is a kind of programmable logic device (PLD) used to implement combinational logic circuits. The PLA has a set of programmable AND gate planes, which link to a set of programmable OR gate planes, which can then be conditionally complemented to produce an output. It has $2^N$ AND Gates for N input variables and for M outputs from PLA, there should be M OR Gates, each with programmable inputs from all of the AND gates. This layout allows for a large number of logic functions to be synthesized in the sum of products canonical forms.

3) Hardware Description Language (https://en.wikipedia.org/wiki/Hardware_description_language): in electronics, a Hardware Description Language (HDL) is a specialized computer language, similar to C language, used to describe the structure and behavior of electronic circuits, and most commonly, digital logic circuits. A hardware description language enables a precise, formal description of an electronic circuit that allows for the automated analysis and simulation of an electronic circuit. HDL can be applied in the present invention to describe a digital logic circuit design, as well as the bitstream files used to program PLD's. It is also comprised in the present invention for one to write digital hardware logic in a Hardware Description Language (HDL) or provide the bitstream to program the reconfigurable hardware directly to attend one's application requirements or improve the execution of the code.

4) A Shared library or Shared object (https://en.wikipedia.org/wiki/Library (computing)#Shared_libraries) is a file that is intended to be shared by executable files and further shared object files. Modules used by a program are loaded from individual shared objects into memory at load time or run time, rather than being copied by a linker when it creates a single monolithic executable file for the program. Most modern operating systems can have shared library files of the same format as the executable files.

SUMMARY

The present invention abstracts the process of programming and driving programmable logic circuits, such as PLD's and FPGA's by software applications calling specific libraries or DLLs which can configure this circuits to perform functions usually performed by software.

This approach allows great simplicity since linking and invocation processes of software applications are as transparent as calling a regular shared object (e.g. DLL) interface, while it also allows the library to hide the complexity of programming and driving programmable logic circuits.

Actually, software applications may ignore how the libraries will implement their functions, which can be done by a software and/or hardware implementation depending on the availability of resources.

The method of the present invention allows the usage of a dynamically reconfigurable hardware structure to accelerate software applications. This is usually achieved by providing bitstream or HDL codes that execute the same functions as default shared libraries in the operating system, but in a more efficient manner, saving execution time, energy and allowing the system to run with more loads and better performance, improving the user experience when using the device.

The main goal of the present invention is the management of reconfigurable hardware resources by the operating system. The OS can program the reconfigurable hardware in real time depending on loaded/running applications, keeping track of free space in PLD hardware and deallocating circuits when they are not needed anymore, therefore saving/reusing hardware resources.

Based on the odds described by the state of the art, the following advantages for the method of the present invention can be listed:
- Intensive function executed by software converted to the hardware-equivalent version programmed in PLD or FPGA;
- Hardware abstraction on high level languages;
- Energy efficient algorithms execution leading to battery endurance increase;
- Security (cryptographic algorithms can be executed on dynamic programmable hardware, isolated from the software layer);
- Improved secure communications: the whole communication data could be asymmetrically encrypted using this invention, rather than only part of the communication as of today;
- Complex and intensive software algorithms speed up when running on equivalent digital circuit.

BRIEF DESCRIPTION OF DRAWINGS

The objectives and advantages of the present disclosure will become clearer through the following detailed description of the example and non-limitative figures presented at the end of this document, wherein.

DESCRIPTION OF EMBODIMENTS

Figure 1:
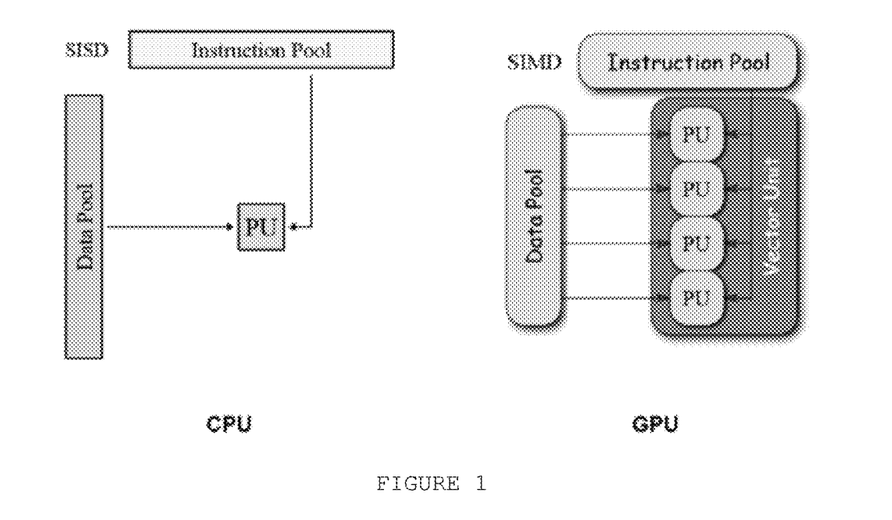
FIG. 1 discloses the used instruction and data structures for current available architectures in most prior art devices, such as, smartphones and computers.

FIG. 1 discloses the used instruction and data structures for current available architectures in most prior art devices, such as, smartphones and computers. The current CPU architecture is known as SISD (Single instruction and single data), i.e. only one instruction is executed for a single input data. If several calculations are needed, the CPU takes longer to complete the task, since it will fetch and perform only one calculation at the time. Multiple cores tend to increase the speed, but by only a small factor (e.g. 2, 4, or 8). The GPU, on the other hand, has its architecture described as a SIMD (Single instruction and multiple data). It can perform the same operation for a collection of data, dramatically increasing the speed of algorithms that need to perform the calculation for several input data. If different operations are needed, even the GPU takes longer to perform the calculations since it will be able to fetch and execute only one instruction at a time.

Figure 2:
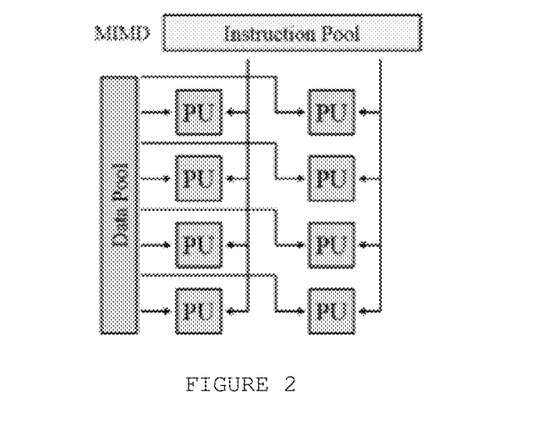
FIG. 2 illustrates the present invention instruction data structure.

FIG. 2 illustrates the present invention instruction data structure. The current architecture is described as MIMD (Multiple instructions and multiple data). The amount of instructions and data that will be calculated at the same moment will only be limited by programmable area available and dependency among previous and future results (iterative calculations).

Figure 3:
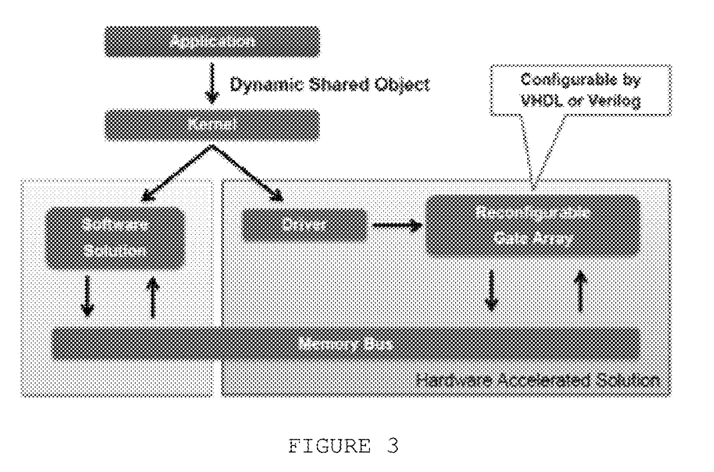
FIG. 3 discloses the block diagram of the method of the present invention.

FIG. 3 discloses the block diagram of the method of the present invention. It shows how the application will access the hardware logic (transparently) through the kernel, which will configure the programmable logic array and make it available through a shared object (e.g. DLL) for the application usage.

Figure 4:
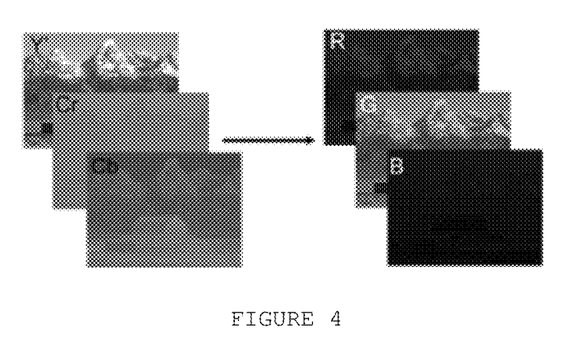
FIG. 4 discloses an example of algorithm being implemented by programmable hardware logic rather than software with much greater performance.

FIG. 4 discloses an example of algorithm being implemented by programmable hardware logic rather than software with much greater performance, video encoding/decoding usually performed by dedicated IC's: the color space conversion that must be executed in order to record a video or during its playback. That happens due to the nature of the visual information, the screen works using 3 values known as RGB (red, green, blue). The video encoder, on the other hand, must receive video in a YUV format (luminance, and chrominance as separated values). The present invention enables the optimization of this kind of operation and several other search and compression algorithms used to efficiently encode a video, in a very flexible and transparent way.

Figure 5:
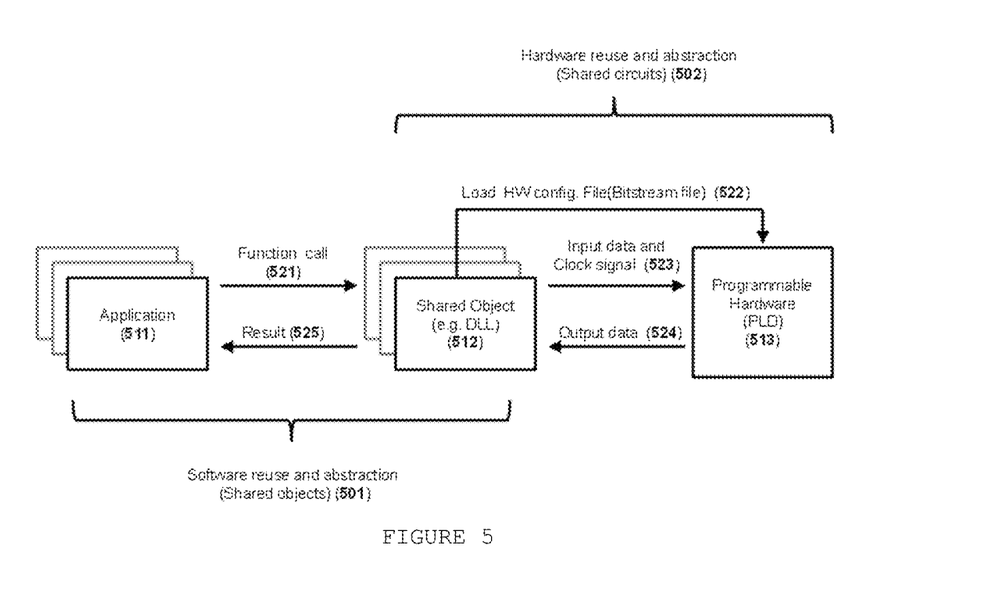
FIG. 5 discloses the relationship between the applications, shared objects (e.g. DLLs) and the programmable hardware logic, according to the method of the present invention.

FIG. 5 discloses the relationship between the applications, shared objects (e.g. DLLs), and the programmable hardware logic. Several applications can depend on several libraries (only one copy of each library will be loaded in RAM). Each library can or cannot have its equivalent digital circuit that can be programmed on hardware. For the ones that can be programmed as logic circuits, there can be one or more instances on the hardware to improve performance and reduce latency.

The method of the present invention aims to abstract the process of programming and driving programmable logic circuits, such as PLD's and FPGA's by software applications calling specific libraries or DLLs which can configure these circuits to perform functions usually performed by software.

The inventive step consists on abstracting the execution of functionalities dynamically implemented in hardware (502) as simply as allocating a dynamic software library (501), achieving dramatically greater execution speeds and transparency for the calling software application. The process of configuring the hardware is completely hidden from the calling application and it includes the process of dynamically programming the hardware on demand, managing the allocation and release of circuits as needed, inputting signals to the programmed circuits and collecting their output signals as data to be returned to the calling application.

Instead of the traditional approach of software being executed by a microprocessor as a sequence of stored instructions, in this new approach the execution of critical parts of an algorithm occur on dedicated programmable circuits, at the same time it combines:
- the flexibility of dynamic software libraries which can be dynamically loaded and unloaded in memory as dynamic objects called by different applications with;
- the analogous flexibility of allocating and releasing the related circuits which are responsible for executing the related called function to be used by different dynamic objects;
- in such a way the input parameters are driven to the programmed circuits, a limited sequence of clock signals, if required, are driven to the circuit and the result signals are available in circuit output as data to be returned to the calling software application through the dynamic objects.

For the calling application the whole process is fully transparent, it does not even know if the algorithm is being executed by software and/or programmable hardware combined. Existing applications can be dynamically linked to libraries (e.g. DLLs) without any modification, at all.

According to FIG. 5, the method of the present invention performs the following steps:

a) An application (511) invokes an API function (521) from a Shared Object (512) such as a dynamic library or similar package.

b) The library (512) is dynamically loaded in memory and linked on demand if not already loaded.

c) The library is associated to a logic circuit configuration file which describes the logic connections within the Programmable Logic Device (PLD) (513).

d) If PLD is not configured with the configuration file related to the API function, it is transmitted and loaded into the PLD (522) to map the logic circuit configurations.

e) Dynamic library writes input data values in the circuit entry and clock signals (523), if required, for driving the logical execution of the function mapped in Hardware.

f) Dynamic library collects output data (524) values which are the result of logic circuits execution by reading the output or exit of the logic circuit.

g) Dynamic library properly converts the logic circuit output to the expected data type specified by the API function.

h) API function returns the data result (525) to the calling application.

i) The digital circuit is automatically unloaded when it's not needed by any running application.

The main concept of the method of the present invention relies on a powerful concept, the Shared Objects (512), popular as Dynamic Link Libraries in Windows environment. Shared Objects are very flexible, and they can be loaded in memory and linked to user applications on demand, and be unloaded automatically when not needed. The present invention takes this concept to dynamic, reconfigurable, programmable hardware (513), which programmable circuits can also be allocated and released on demand with great performance advantages for some applications. Not only that, but dynamic software and dynamic hardware can work together allowing Software and Hardware reuse and abstraction (501 and 502) at the same time.

That is possible because the Shared object (or DLL) is logically connected to a hardware configuration description file (522) which describes circuit connections. The implementation could be as simple as a reference to a configuration file location. The resulted implementation will be flexible enough that, once an external user app (511) calls a function (521), execution can be take place partially in Software by CPU and partially by configurable hardware circuits, depending on the expected performance and resources (memory, circuits) availability.

The beauty on the overall concept resides in the fact that the calling app (511) does not need to be changed in order to take advantage of the resulting architecture. So that, if reconfigurable hardware associated to this technique are made available in a smartphone, for example, the existing mobile applications can take advantage of it without any changes in the regular call, with increased performance, flexibility and transparency, without the applications even knowing that the called function will be executed by the software program and/or by the configurable programmable hardware.

Figure 6:
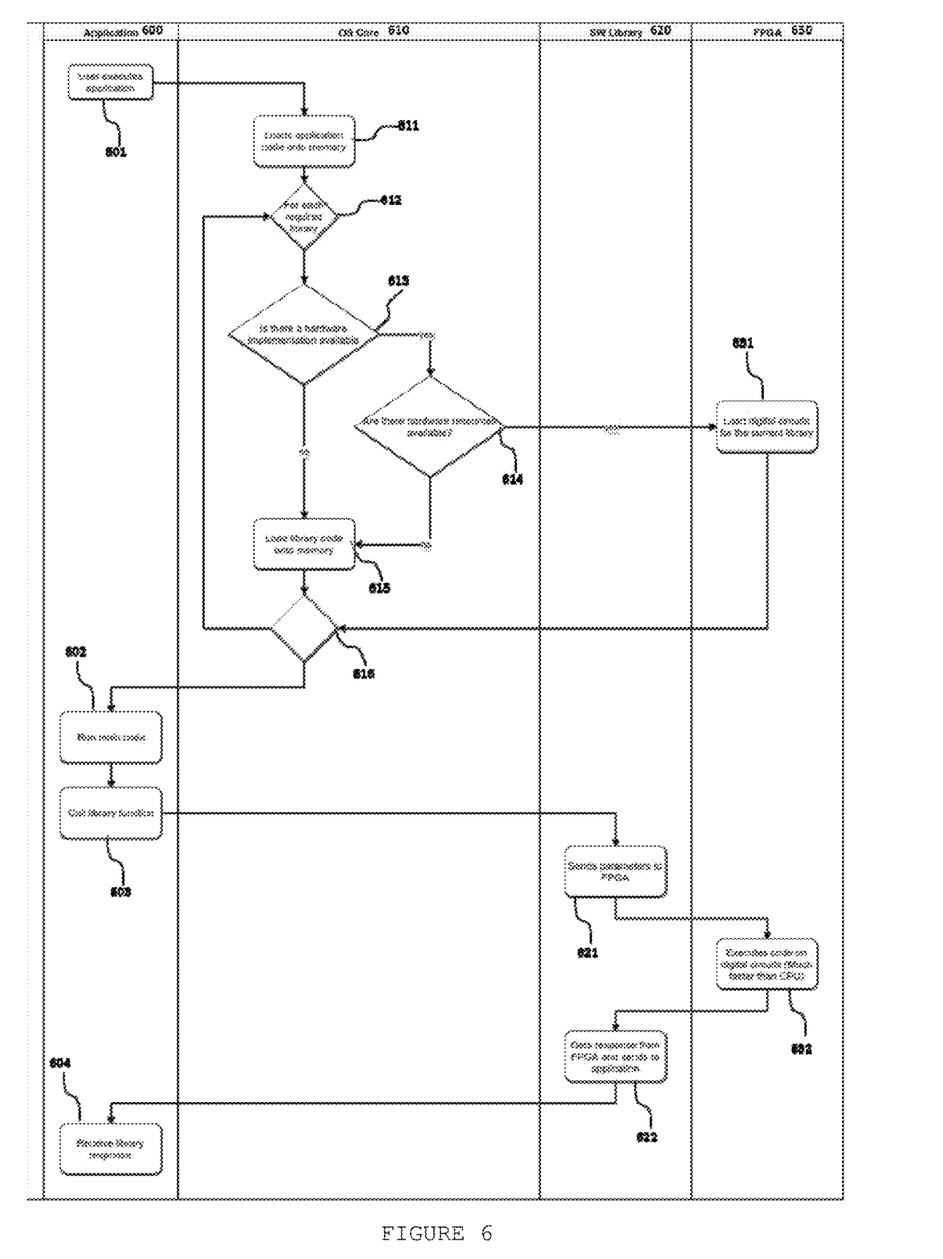
FIG. 6 illustrates this invention with proposed dynamic library loading, including transparent HW programming (e.g., DLL).

One possible implementation of the concept described in this document is depicted in the FIG. 6. The drawing is split in 4 lanes for better understand of the roles involved in the algorithm:

a) The lanes are divided in:
i. Application: represents the calling application in user space, e.g. Camera, Calculator, Calendar, etc. (600).
ii. OS Core: represents the core of the operating system, whatever it is (e.g. Windows, Linux, Android, OSX, etc.) (610).
iii. Software Library: represents a software implementation that will wrap the HW, performing data exchanges and execution triggering, making it transparent to the calling application (620).
iv. PLD/FPGA: represent the steps that will be executed on the digital circuits device (630).

b) The application is started by the user or by the system (601).

c) The OS starts to load the application code to the user space memory (611).

d) The OS iteratively loops through all the requirements for the application (612), and, for each and every one, checks if there is an optimized hardware solution (613) that seamlessly replaces the software version of the library.
i. If the hardware version is available, it loads it in the PLD (631), but only if all required resources are available on it (memory, IO Blocks, clock circuits, etc.) (614).
ii. If the hardware version is not available or if the required hardware resources are not available, the OS loads the software version of the library (615), i.e. it falls back to the solution available before the concept described in this document.

e) After all the required libraries are loaded (616), the operating system handles the control back to the main application (602), and every time it calls a function in which the corresponding library is loaded into the hardware (603), a minimal software wrapper version of the library sends the parameters to the PLD (621) and starts the routine execution on the hardware (632), which runs extremely faster than an execution in the CPU itself due to the parallel nature of the digital circuits concept.

f) After the hardware routine execution, the result data is collected by the SW wrapper library (622) and delivered back to the calling application (604). The later has no information whether the execution took place in the CPU or PLD.

Although the present disclosure has been described in connection with certain preferred embodiments, it should be understood that it is not intended to limit the disclosure to those particular embodiments. Rather, it is intended to cover all alternatives, modifications and equivalents possible within the spirit and scope of the disclosure as defined by the appended claims.

The invention claimed is:

1. A method for managing a programmable logic circuit by invoking a dynamic library function, the method comprising:
invoking an application programming interface (API) function by an application from a shared object such as a dynamic library;
dynamically loading the library in memory and linked on demand if not already loaded;
associating the library to a logic circuit configuration file describing logic connections within a programmable logic device (PLD), wherein logic circuits in the PLD can be configured by using bitstream or HDL codes;

if the PLD is not configured with the configuration file related to the API function, transmitting and loading the configuration file into the PLD to map a logic circuit configuration;

writing, through the dynamic library, input data values as a circuit entry and clock signal, if required, for driving logical execution of the function mapped in hardware;

collecting through the dynamic library output data values resulting of logic circuit execution by reading output of the logic circuit;

properly converting through the dynamic library, the output of the logic circuit to an expected data type specified by the API function; and returning through the API function data results to a calling application.

2. The method according to claim 1, wherein an operating system can manage and configure hardware resources in the PLD, automatically allocating and deallocating circuits on demand and optimizing usage of hardware resources.

3. The method according to claim 1, wherein the circuit is automatically unloaded when not needed by a running application.

4. The method according to claim 1, wherein the invoked API function from a dynamic library or similar package can be implemented from custom libraries or libraries traditionally available in an operating system.

5. The method according to claim 1, wherein execution of computation-intensive algorithms occurs either explicitly by hardware on programmable logic circuits versus by program applications, or automatically depending on resources availability and performance criteria.

6. The method according to claim 1, wherein input parameters are driven to programmed circuits, a limited sequence of clock signals driveable to the programmed circuits and result signals become available as data to be returned to the calling application through dynamic objects.

7. The method according to claim 1, wherein programmable logic circuit building blocks can be as complex as: microprocessors, buffers, multiplexers or converters blocks connectable by programming a matrix of connections.

* * * * *

UNITED STATES PATENT AND TRADEMARK OFFICE
CERTIFICATE OF CORRECTION

PATENT NO. : 10,607,037 B2
APPLICATION NO. : 16/059230
DATED : March 31, 2020
INVENTOR(S) : Romeu Palos De Gouvêa It is certified that error appears in the above-identified patent and that said Letters Patent is hereby corrected as shown below:

On the Title Page

Item [73]
Delete "ELECTR ÔNICA" and insert -- ELETRÔNICA --, therefor.

Signed and Sealed this
Fourth Day of August, 2020

Andrei Iancu
*Director of the United States Patent and Trademark Office*